(12) United States Patent
Nakagawa et al.

(10) Patent No.: US 7,858,995 B2
(45) Date of Patent: Dec. 28, 2010

(54) SEMICONDUCTOR LIGHT EMITTING DEVICE

(75) Inventors: Satoshi Nakagawa, Kyoto (JP); Hiroki Tsujimura, Kyoto (JP)

(73) Assignee: Rohm Co., Ltd., Kyoto-shi, Kyoto-fu (JP)

( * ) Notice: Subject to any disclaimer, the term of this patent is extended or adjusted under 35 U.S.C. 154(b) by 319 days.

(21) Appl. No.: 12/222,126

(22) Filed: Aug. 1, 2008

(65) Prior Publication Data

US 2009/0050917 A1     Feb. 26, 2009

(30) Foreign Application Priority Data

| Aug. 3, 2007 | (JP) | ............................. 2007-202959 |
| Aug. 3, 2007 | (JP) | ............................. 2007-203017 |
| Aug. 10, 2007 | (JP) | ............................. 2007-209719 |

(51) Int. Cl.
    *H01L 21/00* (2006.01)

(52) U.S. Cl. .............................. 257/89; 257/92; 257/95; 257/E21.009; 257/E21.211; 257/E33.005; 257/E33.008; 257/E33.023; 257/E33.055; 257/E33.067; 257/E33.074

(58) Field of Classification Search .................... 257/13, 257/89–97, E21.009, 211, E29.089, E33.005–E33.025, 257/55–67, 74
    See application file for complete search history.

(56) References Cited

U.S. PATENT DOCUMENTS

| 7,186,302 B2* | 3/2007 | Chakraborty et al. | ......... 148/33 |
| 7,504,274 B2* | 3/2009 | Chakraborty et al. | ......... 438/46 |
| 7,709,824 B2* | 5/2010 | Choi et al. | .................... 257/13 |
| 2009/0146162 A1* | 6/2009 | Chakraborty et al. | ......... 257/94 |
| 2009/0194761 A1* | 8/2009 | Masui et al. | ................... 257/13 |
| 2009/0309110 A1* | 12/2009 | Raring et al. | ................. 257/89 |
| 2009/0315055 A1* | 12/2009 | Tamboli et al. | ............... 257/98 |
| 2010/0032695 A1* | 2/2010 | Fellows-Demille et al. | ... 257/89 |

OTHER PUBLICATIONS

Tetsuya Takeuchi et al.: "Theoretical Study of Orientation Dependence of Piezoelectric Effects in Wurtzite Strained GaInN/GaN Heterostructures and Quantum Wells" Japanese Journal of Applied Physics; vol. 39, 2000, pp. 413-416.

* cited by examiner

*Primary Examiner*—Michael S Lebentritt
(74) *Attorney, Agent, or Firm*—Rabin & Berdo, PC

(57) ABSTRACT

A semiconductor light emitting device includes a substrate, and a light emitting portion that is disposed on the substrate, and includes an active layer formed of a group III nitride semiconductor using a nonpolar plane or a semipolar plane as a growth principal surface, in which side end surfaces of the active layer are specular surfaces.

20 Claims, 15 Drawing Sheets

SEMICONDUCTOR LIGHT EMITTING DEVICE

CROSS REFERENCE TO RELATED APPLICATIONS AND INCORPORATION BY REFERENCE

This application is based upon and claims the benefit of priority from prior Japanese Patent Application P2007-209719 filed on Aug. 10, 2007, prior Japanese Patent Application P2007-202959 filed on Aug. 3, 2007 and prior Japanese Patent Application P2007-203017 filed on Aug. 3, 2007; the entire contents of which are incorporated by reference herein.

BACKGROUND OF THE INVENTION

1. Field of the Invention

The present invention relates to a semiconductor light emitting device including an active layer formed of a group III nitride semiconductor, and particularly relates to a semiconductor light emitting device using a nonpolar plane or a semipolar plane as a growth principal surface.

2. Description of the Related Art

A semiconductor light emitting device formed of a group III nitride semiconductor is used for a light emitting diode (LED) and the like. As examples of the group III nitride semiconductor, there are aluminum nitride (AlN), gallium nitride (GaN), indium nitride (InN) and the like. A typical group III nitride semiconductor is represented as $Al_xIn_yGa_{1-x-y}N$ ($0 \leq x \leq 1$, $0 \leq y \leq 1$, $0 \leq x+y \leq 1$). The gallium nitride (GaN) is a group III nitride semiconductor that is well known among hexagonal compound semiconductors containing nitrogen.

In general, a semiconductor light emitting device using GaN has a structure in which an n-type GaN layer, an active layer (light emitting layer) and a p-type GaN layer are stacked on a GaN substrate, and emits light generated in the active layer to an outside of the semiconductor light emitting device. In recent years, use of a semiconductor light emitting device that emits a polarization has been advanced. If the semiconductor light emitting device that emits the polarization is used as a liquid crystal backlight or a projector light source, then a light component attenuated by a polarizer is reduced. As a result, efficiency of the liquid crystal backlight or the projector light source is enhanced.

A semiconductor light emitting device formed of a group III nitride semiconductor using a nonpolar plane or a semipolar plane as a growth principal surface emits the polarization. In a semiconductor light emitting device of the related art, side end surfaces thereof as cut surfaces when the semiconductor light emitting device is formed into a chip are not specular surfaces, since there is an advantage that a quantity of light extracted in the case where a light extraction surface is a rugged-state plane (rough plane) is large. However, the light extracted from the rough plane is random light owing to diffused reflection. As a result, a polarization direction of the polarization extracted from each of the side end surfaces of the semiconductor light emitting device is disturbed, and a polarization ratio of the polarization emitted from the semiconductor light emitting device is decreased.

SUMMARY OF THE INVENTION

An aspect of the present invention is a semiconductor light emitting device including a substrate, and a light emitting portion that is disposed on the substrate, and includes an active layer formed of a group III nitride semiconductor using a nonpolar plane or a semipolar plane as a growth principal surface, in which side end surfaces of the active layer are specular surfaces.

Another aspect of the present invention is a light emitting system including a mounting base; a semiconductor light emitting device that is disposed on the mounting base, and includes a light emitting portion having an active layer formed of a group III nitride semiconductor using a nonpolar plane or a semipolar plane as a growth principal surface, in which side end surfaces of the active layer are specular surfaces; and a light transmissive resin portion that is disposed on the mounting base so as to cover the semiconductor light emitting device, and has a non-arrayed structure in resin molecules.

Still another aspect of the present invention is a light emitting system including a mounting base; and a semiconductor light emitting device that is disposed on the mounting base, and includes a light emitting portion having an active layer formed of a group III nitride semiconductor using a nonpolar plane or a semipolar plane as a growth principal surface, in which side end surfaces of the active layer are specular surfaces, wherein at least a part of an inner surface of the mounting base, the inner surface facing to the semiconductor light emitting device, is a specular surface.

DETAILED DESCRIPTION OF THE INVENTION

Figure 1A:
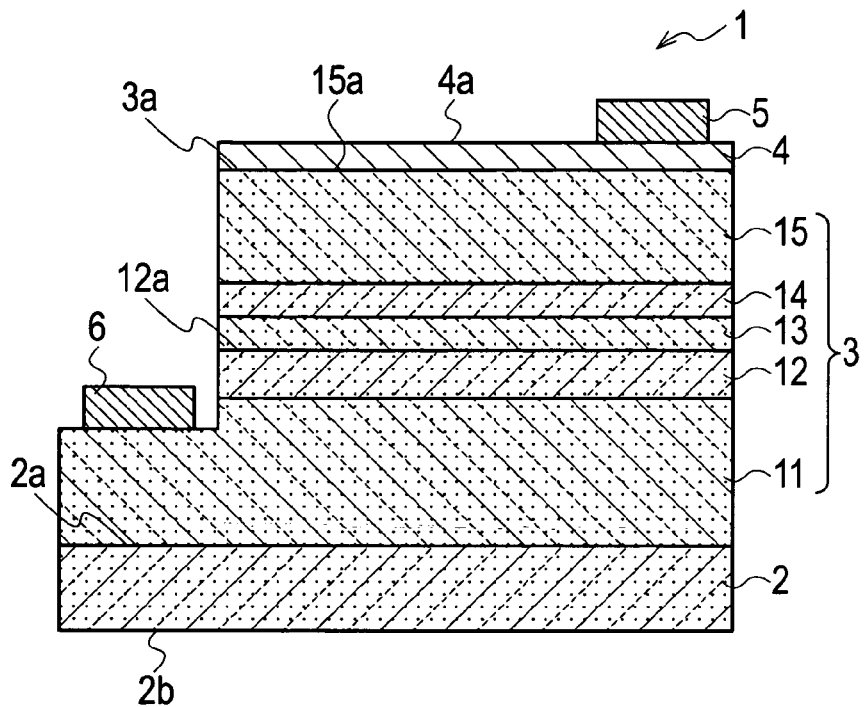
FIG. 1A is a cross-sectional view showing a configuration example of a semiconductor light emitting device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

Figure 1B:
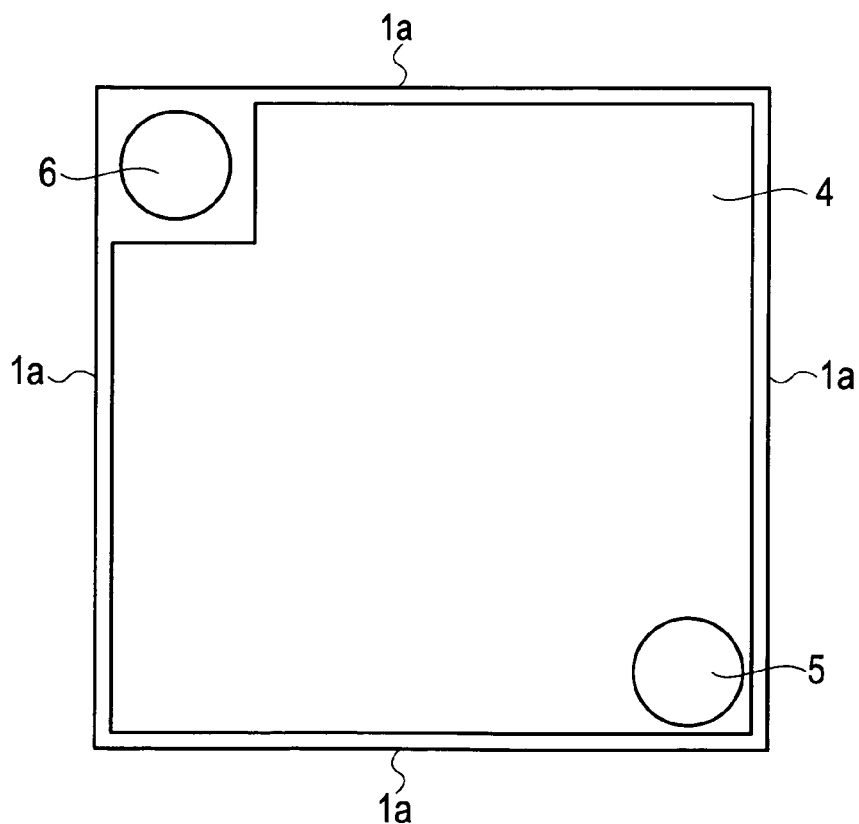
FIG. 1B is a plan view showing the configuration example of the semiconductor light emitting device according to the first embodiment of the present invention.

As shown in FIGS. 1A and 1B, a semiconductor light emitting device 1 according to a first embodiment of the present invention includes: a substrate 2; and a light emitting portion 3 disposed on a surface 2a of the substrate 2, in which side end surfaces 1a are specular surfaces. The side end surfaces 1a are composed of surfaces adjacent to the surface 2a of the substrate 2 and to a surface 3a as a growth principal surface of the light emitting portion 3. Here, "a specular surface" as each of the side end surfaces 1a refers to a surface in which a difference in irregularities of the side end surfaces 1a is equal to or less than a wavelength of a polarization generated by an active layer 12. The light emitting portion 3 includes an active layer 12 formed of a group III nitride semiconductor using a nonpolar plane or a semipolar plane as a growth principal surface 12a, and emits the polarization from the active layer 12. Moreover, as shown in FIGS. 1A and 1B, the semiconductor light emitting device 1 includes: a first electrode portion (anode electrode) 4; and a second electrode (cathode electrode) 6.

The substrate 2 is formed of conductive n-type GaN having a hexagonal crystalline structure, into which silicon is doped as an n-type dopant. It is preferable that the substrate 2 has a thickness enabling the substrate 2 concerned to be subjected to cleavage. Specifically, it is preferable that the substrate 2 has a thickness of approximately 100 μm or less. Moreover, the side end surfaces 1a adjacent to the surface 2a among surfaces of the substrate 2 are specular surfaces. For example, the side end surfaces 1a are subjected to mirror finish treatment so that the difference in irregularities of the side end surfaces 1a is 100 nm or less.

The light emitting portion 3 is epitaxially grown on the surface 2a of the substrate 2. For example, the surface 2a of the substrate 2 is an m-plane as a nonpolar plane of a hexagonal crystal. A description will be made below in an illustrative manner of the case where the surface 2a is the m-plane.

Figure 2A:
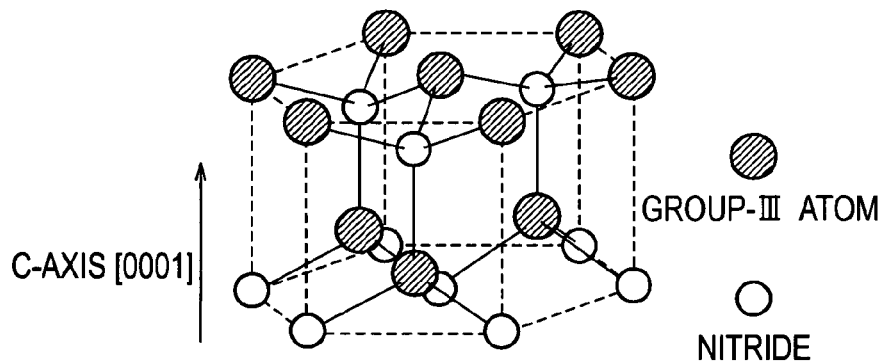
FIGS. 2A to 2C are schematic views for explaining a hexagonal crystalline structure.

A description will be made of the hexagonal crystalline structure owned by the group III nitride semiconductor such as GaN with reference to FIGS. 2A to 2C. FIG. 2A is a schematic view showing a unit cell of the hexagonal crystalline structure.

As shown in FIG. 2A, in the group III nitride semiconductor having the hexagonal crystalline structure, four nitrogen atoms are bonded to one group III atom. The four nitrogen atoms are arranged on four vertices of a regular tetrahedron in which the group III atom is disposed in a center. With regard to these four nitrogen atoms, one nitrogen atom is disposed in a +c-axis direction with respect to the group III atom, and the other three nitrogen atoms are arranged on a −c-axis side with respect to the group III atom. In such a way, in the hexagonal group III nitride semiconductor, dielectric polarization is formed along the c-axis direction.

Figure 2B:
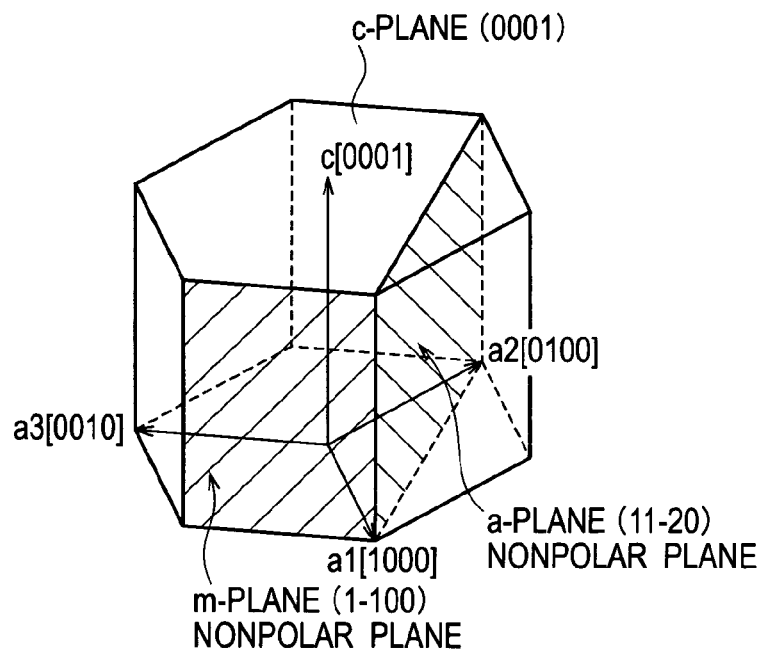
Figure 2C:
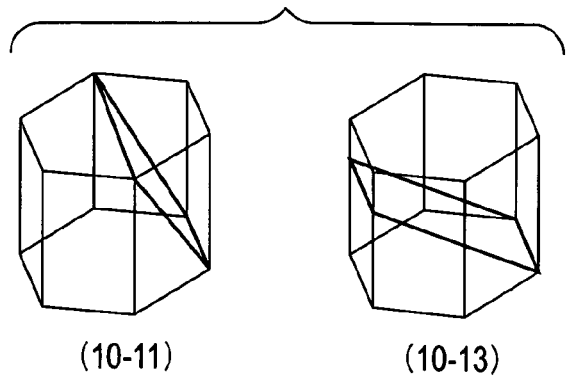

As shown in FIG. 2B, the c-axis goes along a center axis direction of a hexagonal column, and a plane (top plane of the hexagonal column) in which the c-axis is a normal line is a c-plane (0001). When the crystal of the group III nitride semiconductor is subjected to the cleavage along two planes parallel to the c-plane, such a +c-plane becomes a crystal plane on which the group III atoms are arrayed, and such a −c-plane becomes a crystal plane in which nitrogen atoms are arrayed. Accordingly, the +c-plane and the −c-plane are polarity planes exhibiting different properties from each other.

A side plane of the hexagonal column is the m-plane (1-100), and a plane that passes through a pair of edge lines which are not adjacent to each other is an a-plane (11-20). The m-plane and the a-plane are crystal planes adjacent to the c-plane, and are perpendicular to a dielectric polarization direction, and accordingly, are planes which do not have polarity, that is, nonpolar planes. Moreover, as shown in FIG. 2C, crystal planes inclined with respect to the c-plane (that is, neither parallel nor perpendicular thereto) obliquely intersect the dielectric polarization direction, and accordingly, are planes which have some polarity, that is, semipolar planes. Specific examples of the semipolar planes are a (10-11) plane, a (10-13) plane, a (11-22) plane, and the like.

The light emitting portion 3 is formed in such a manner that the group III nitride semiconductor having the hexagonal crystalline structure is epitaxially grown on the surface 2a of the substrate 2. The light emitting portion 3 is an LED with a structure in which, in order from the substrate 2 side, there are stacked: a first semiconductor layer (n-type contact layer) 11; the active layer 12; a final barrier layer 13; a p-type electron stopping layer 14; and a second semiconductor layer (p-type contact layer). As described above, the surface 2a of the substrate 2 is the m-plane, and accordingly, the surface 3a of the light emitting portion 3 stacked on the surface 2a of the substrate 2 and the growth principal surface 12a of the active layer stacked thereon also become m-planes.

For example, the first semiconductor layer 11 is formed of an n-type GaN layer with a thickness of approximately 3 μm or more, into which silicon with a concentration of approximately $1\times10^{18}$ cm$^{-3}$ is doped as the n-type dopant.

For example, the active layer 12 has a quantum well structure in which an In$_z$Ga$_{1-z}$N layer with a thickness of approximately 3 nm and a GaN layer with a thickness of approximately 9 nm, into each of which is silicon is doped, are alternately stacked in approximately five cycles. For example, the active layer 12 emits blue light (with a wavelength of approximately 430 nm). At this time, Z as a ratio of In with respect to Ga in the In$_z$Ga$_{1-z}$N layer is "$0.05 \leq Z \leq 0.2$". Note that, in the case of emitting green light, Z is set as: "$Z \geq 0.2$".

The final barrier layer 13 is formed of a GaN layer with a thickness of approximately 40 nm. Note that, with regard to doping, any may be selected from p-type doping, n-type doping, and non-doping; however, the non-doping is preferable.

The p-type electron stopping layer 14 is formed of an AlGaN layer with a thickness of approximately 28 nm, into which magnesium with a concentration of approximately $3\times10^{19}$ cm$^{-3}$ is doped as a p-type dopant.

The second semiconductor layer 15 is formed of a p-type GaN layer with a thickness of approximately 70 nm, into which magnesium with a concentration of approximately $1\times10^{20}$ cm$^{-3}$ is doped as a p-type dopant. From a light extraction surface 15a of the second semiconductor layer 15, the light emitted from the active layer 12 is extracted to an outside of the semiconductor light emitting device 1. It is preferable that the light extraction surface 15a be a specular surface so that a difference in irregularities of the light extraction surface 15a is approximately 100 nm or less in order to suppress scattering of the light and to suppress a decrease of a polarization ratio. The light extraction surface 15a is the surface 3a of the light emitting portion 3.

The first electrode portion 4 is formed of ZnO through which the output light from the active layer 12 is transmittable. The first electrode portion 4 is connected to the second semiconductor layer 15 in an ohmic manner. In order to uniformly flow a current through the entire area of the light emitting portion 3 in a horizontal direction (direction perpendicular to a stacked direction), the first electrode portion 4 is formed so as to cover substantially the entire upper surface of the second semiconductor layer 15. The first electrode portion 4 has a thickness from approximately 200 nm to approximately 300 nm, which enables the light emitted by the active layer 12 to transmit therethrough. A light extraction surface 4a of the first electrode portion 4 is a surface from which the light emitted by the active layer 12 is extracted to the outside of the semiconductor light emitting device 1. Therefore, it is preferable that the light extraction surface 4a be subjected to the mirror finish treatment so that a difference in surface irregularities of the light extraction surface 4a is approximately 100 nm or less in a similar way to the light extraction surface 15a of the second semiconductor layer 15. For example, if an electron beam evaporation method is used, then such a specular surface as described above can be obtained.

As described above, the scattering of the light can be suppressed by the light extraction surface 15a and the light extraction surface 4a, which are in a state of the specular surfaces. Accordingly, the polarization emitted from the active layer 12 is extracted to the outside of the semiconductor light emitting device 1 while highly maintaining the polarization ratio. On a partial region on the first electrode portion 4, a connection portion 5 in which a titanium (Ti) layer and an Au layer are stacked on each other is provided.

The second electrode 6 is formed by stacking a Ti layer and an aluminum (Al) layer on each other. The second electrode 6 is formed on an exposed region of an upper surface of the first semiconductor layer 11 so as to be connected to the first semiconductor layer 11 in an ohmic manner.

Next, a description will be made of operations of the semiconductor light emitting device 1 according to the first embodiment. In the semiconductor light emitting device 1, when a voltage is applied thereto in a forward direction, holes are supplied from the first electrode portion 4, and electrons are supplied from the second electrode 6. Then, the electrons are injected into the active layer 12 through the first semiconductor layer 11, and the holes are injected into the active layer 12 through the semiconductor layers 13 to 15. The electrons and the holes, which are injected into the active layer 12, are coupled to each other, and emit the light with a peak wavelength of approximately 430 nm. The growth principal surface of the light emitting portion 3 is the m-plane as the nonpolar plane, and accordingly, the light emitted by the active layer 12 is a polarization. Here, it is not necessary that the polarization emitted by the active layer 12 is a completely linear polarization, and a polarization direction of the polarization is a direction where a linear polarization component is the largest.

Among the polarization generated in the active layer 12, light that travels toward the first electrode portion 4 side transmits through the first electrode portion 4 and is emitted to the outside of the semiconductor light emitting device 1. Meanwhile, among the polarization generated in the active layer 12, light that travels toward the substrate 2 side transmits through the first semiconductor layer 11 and the substrate 2, and reaches a back surface 2b of the substrate 2. A part of the polarization that has reached the back surface 2b of the substrate 2 is reflected to a direction of the first electrode portion 4 by the back surface 2b of the substrate 2, and the other part of the polarization transmits through the back surface 2b, and is emitted to the outside of the semiconductor light emitting device 1. Moreover, among the polarization generated by the active layer 12, light that travels toward the side end surfaces 1a is emitted from the side end surfaces 1a to the outside of the semiconductor light emitting device 1. The side end surfaces 1a are the specular surfaces subjected to the mirror finish treatment, and accordingly, with regard to the light emitted from the side end surfaces 1a to the outside, diffused reflection thereof owing to roughness of the surfaces concerned is suppressed, and a state of the polarization is maintained. Therefore, the polarization that maintains a high polarization ratio is extracted to the outside of the semiconductor light emitting device 1.

A description will be made below of an example of a manufacturing method of the semiconductor light emitting device 1 according to the first embodiment.

First, there is prepared the substrate 2, which is formed of a single crystal of GaN, and in which the surface 2a is the m-plane, and the thickness is approximately 300 µm. The substrate 2 using the m-plane as the surface 2a is created in such a manner that a slice for the substrate 2 is cut out from the GaN single crystal using the c-plane as a principal surface, and is thereafter polished by a chemical-mechanical polishing (CMP) method so that directional errors thereof with respect to both of the (0001) orientation and the (11-20) orientation can be ±1° or less (preferably ±0.3°). In such a way, the substrate 2 can be obtained, in which the m-plane is used as the surface 2a, an amount of crystal defects such as dislocations and stack faults is small, and the difference in irregularities of the surface 2a is suppressed to the atomic level.

Next, the light emitting portion 3 is epitaxially grown on the surface 2a of the substrate 2 by a metal-organic chemical vapor deposition (MOCVD) method. Specifically, the substrate 2 is introduced into a processing chamber of an MOCVD apparatus (not shown), and is placed on a heatable and rotatable susceptor. An atmosphere in the processing chamber is evacuated so that a pressure in the processing chamber can range within 1/10 atmospheric pressure to normal atmospheric pressure.

A temperature of the substrate 2 is raised to approximately 1000° C. to approximately 1100° C. while supplying ammonia gas into the processing chamber by carrier gas ($H_2$ gas) in order to suppress the roughness of the surface 2a of the substrate 2. The substrate 2 has a thickness of approximately 300 µm, and accordingly, deformation of the substrate 2 owing to the above-described temperature is suppressed.

Next, ammonia gas, trimethylgallium (TMG) gas and silane are supplied into the processing chamber by the carrier gas, whereby the first semiconductor layer 11 formed of the n-type GaN layer into which silicon is doped is epitaxially grown on the surface 2a of the substrate 2.

After the temperature of the substrate 2 is set at approximately 700° C. to approximately 800° C., the active layer 12 is formed on the first semiconductor layer 11. Specifically, the ammonia gas and the TMG gas are supplied into the processing chamber by the carrier gas, and a barrier layer (not shown) formed of such a non-doped GaN layer is epitaxially grown on the first semiconductor layer 11. Moreover, in a state where the substrate 2 is held at the above-described temperature, the ammonia gas, the TMG gas, trimethylindium (TMI) gas and silane gas are supplied into the processing chamber by the carrier gas, whereby a well layer (not shown) formed of n-type InGaN layer into which silicon is doped is epitaxially grown on the barrier layer. The barrier layer and the well layer are alternately formed a desired number of times by the above-described method, whereby the active layer 12 is formed. Thereafter, ammonia and trimethylgallium are supplied into the processing chamber by the carrier gas, whereby the final barrier layer 13 formed of the GaN layer is grown.

After the temperature of the substrate 2 is raised to approximately 1000° C. to approximately 1100° C., the ammonia gas, the TMG gas, trimethylaluminum (TMA) gas and bis(cyclopentadienyl)magnesium ($Cp_2Mg$) gas are supplied into the processing chamber, whereby the p-type electron stopping layer 14 formed of the p-type AlGaN layer into which magnesium is doped is epitaxially grown on the final barrier layer 13.

Next, in a state where the temperature of the substrate 2 is maintained at approximately 1000° C. to approximately 1100° C., the ammonia gas, the TMG gas and the $Cp_2Mg$ gas are supplied into the processing chamber by the carrier gas, whereby the second semiconductor layer 15 formed of the p-type GaN layer into which magnesium is doped is epitaxially grown on the p-type electron stopping layer 14.

In such a way, the respective layers are formed so that the growth principal surface 12a of the active layer 12 and the respective principal surfaces of the first semiconductor layer 11, the final barrier layer 13 and the p-type electron stopping layer 14 can be the nonpolar m-planes.

Subsequently, by a sputtering method or a vacuum evaporation method, the first electrode portion 4 formed of ZnO is formed entirely on the light extraction surface 15a of the second semiconductor layer 15.

The first electrode portion 4 and the light emitting portion 3 are etched by using, as an etching mask, resist formed into a desired pattern, whereby a partial region of the first semiconductor layer 11 is mesa-etched, and the electrode surface is exposed. The Ti layer and the Al layer are sequentially stacked on the exposed electrode surface by a resistance heating method or a vacuum evaporation method such as the electron beam method, whereby the second electrode 6 is formed.

Next, the back surface 2b side of the substrate 2 is polished by mechanical polishing until the thickness of the substrate 2 becomes approximately 100 µm or less.

Figure 3A:
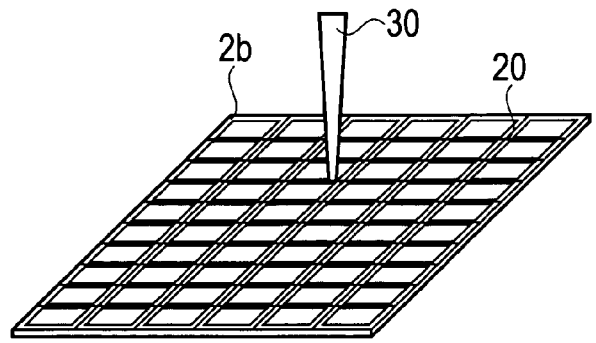
FIGS. 3A to 3D are process cross-sectional views for explaining a manufacturing method of the semiconductor light emitting device according to the first embodiment of the present invention.
Figure 3B:
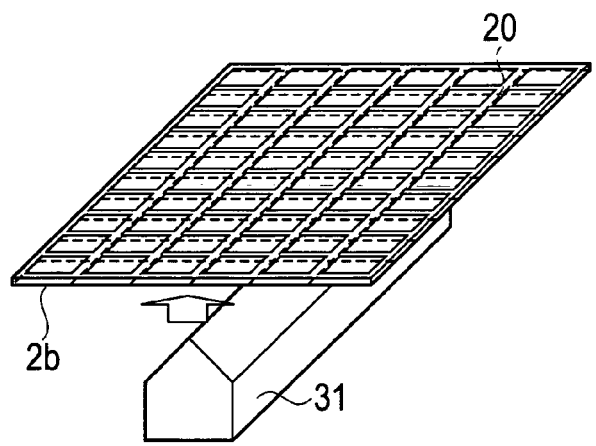
Figure 3C:
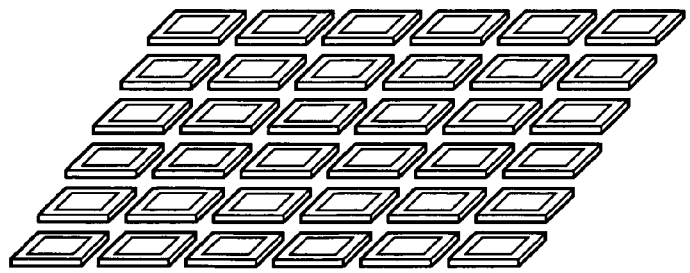

Thereafter, as shown in FIG. 3A, the back surface 2b of the substrate 2 is ground by using a scriber 30 such as a diamond, and chip-dividing scribing lines 20 are formed. After forming the scribing lines 20, as shown in FIG. 3B, a stress is applied to spots, on which the scribing lines 20 are formed, by using a breaker 31 such as ceramics. The stress is applied to the spots on which the scribing lines 20 are formed, whereby the substrate 2 can be divided per chip unit as shown in FIG. 3C.

Figure 3D:
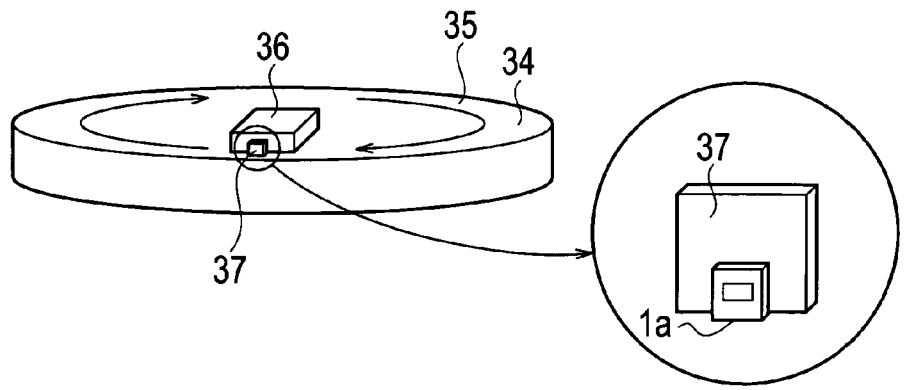
Figure 4:
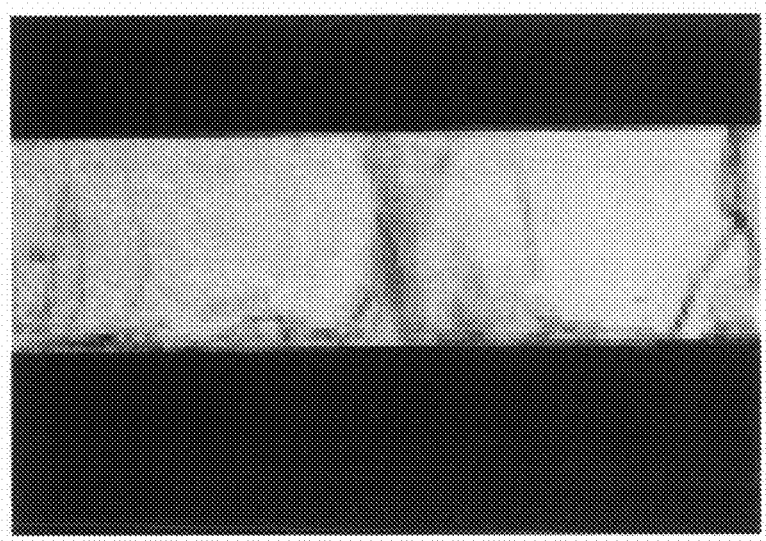
FIG. 4 is an electron microscope photograph of a spot on which a scribing line is formed.
Figure 5:
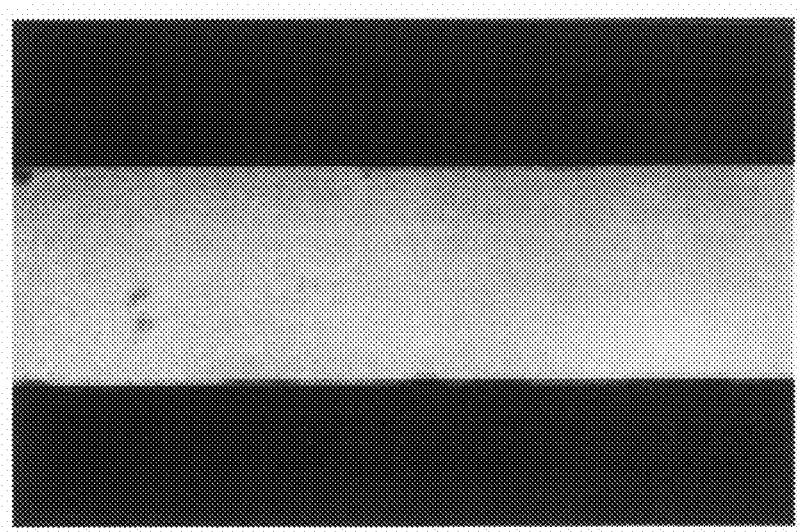
FIG. 5 is an electron microscope photograph after the spot on which the scribing line is formed is polished.

In each of the side end surfaces 1a formed by such chip division, the c-plane is a cleavage plane, and becomes a specular surface. However, the a-plane in the side end surfaces 1a becomes a rough surface since it is not the cleavage plane. Moreover, the spots of the side end surfaces 1a of the substrate 2, on which the scribing lines 20 are formed, also become rough surfaces as shown in FIG. 4. FIG. 4 is an electron microscope photograph of the spot on which the subscribing line is formed. Accordingly, the spot of the side end surface 1a of the substrate 2, which is roughened by the subscribing line 20, is polished and subjected to the mirror finish treatment. Since the thickness of the substrate 2 is as thin as approximately 100 µm, it is difficult to polish the side end surface 1a. Therefore, as shown in FIG. 3D, a dummy substrate 37 onto which the device subjected to the chip division is pasted is attached onto a jig 36. Then, the jig 36 is placed on a polishing apparatus 35, the side end surface 1a of the substrate 2 is polished by a polishing sheet 34 of the polishing apparatus 35, whereby the side end surface 1a is subjected to the mirror finish treatment. In the case of using a polishing sheet 34 with roughness in which a difference in surface irregularities is approximately 100 nm, the side end surface 1a of the substrate 2 becomes the specular surface in which the difference in irregularities is 100 nm or less. As shown in FIG. 5, the polished side end surface 1a of the substrate 2 has become the specular surface as a result that such a rough surface is polished. FIG. 5 is an electron microscope photograph after the spot on which the scribing line is formed is polished.

By the above-described steps, the semiconductor light emitting device 1 according to the first embodiment is completed.

In the above-described step of polishing the side end surfaces 1a, the method using the polishing sheet 34 has been shown; however, the side end surfaces 1a may be polished by using the CMP method, or the polishing sheet 34 and the CMP method may be combined together.

In the semiconductor light emitting device 1 according to the first embodiment of the present invention, each of the side end surfaces 1a is entirely the specular surface. Accordingly, with regard to the light emitted to the outside from the entire side end surface 1a like an LED, the diffused reflection thereof owing to the roughness of the surface concerned is suppressed, and the state of the polarization can be maintained. As a result, in the semiconductor light emitting device 1 shown in FIGS. 1A and 1B, the polarization that maintains a high polarization ratio can be extracted to the outside of the semiconductor light emitting device 1.

Moreover, in accordance with the semiconductor light emitting device 1, the substrate 2 is composed of GaN having conductivity, and accordingly, a light emitting portion 3 in which the amount of stack faults is small and crystallinity is high can be formed. In such a way, light emission efficiency of the active layer 12 can be enhanced.

Furthermore, in accordance with the semiconductor light emitting device 1, the surface 2a of the substrate 2 is composed of the m-plane as the nonpolar plane, thus making it possible to suppress the dielectric polarization of the growth surface of the light emitting portion 3 at the time when the light emitting portion 3 is grown. In such a way, the light emitting portion 3 can be grown as a stable growth surface, and accordingly, the crystallinity of the light emitting portion 3 can be enhanced. As a result, the light emission efficiency of the active layer 12 can be enhanced, and in addition, the polarization ratio of the emitted light can be enhanced.

Moreover, in accordance with the semiconductor light emitting device 1, the substrate 2 is polished so that the thickness thereof can be approximately 100 µm or less before performing the chip division, and accordingly, the chip division by the cleavage is possible. In such a way, the semiconductor light emitting device 1 can be easily subjected to the chip division.

Note that the configuration of the semiconductor light emitting device 1 is not limited to such a configuration as described above. For example, the second electrode 6 may be placed on a surface that is in contact with the substrate 2 formed of the single crystal of GaN and is opposite to a surface of the substrate 2, which is in contact with the first semiconductor layer 11.

Second Embodiment

A description will be made below of a manufacturing method of a semiconductor light emitting device 1 according to a second embodiment of the present invention. A configuration of the semiconductor light emitting device 1 manufactured by the manufacturing method according to the second embodiment is substantially similar to that of the semiconductor light emitting device 1 described in the first embodiment, and accordingly, a duplicate description will be omitted.

There is prepared such a substrate 2, which is formed of the single crystal of GaN, and in which the surface 2a is the m-plane, and the thickness is approximately 300 µm. The light emitting portion 3 is epitaxially grown on the surface 2a of the substrate 2 by the MOCVD method.

Next, by the sputtering method or the vacuum evaporation method, the first electrode portion 4 formed of ZnO is formed entirely on the light extraction surface 15a of the second semiconductor layer 15.

Subsequently, the first electrode portion 4 and the light emitting portion 3 are etched by using, as an etching mask, the resist formed into the desired pattern, whereby a partial region of the first semiconductor layer 11 is mesa-etched, and the electrode surface is exposed. Then, the Ti layer and the Al layer are sequentially stacked on the exposed electrode surface by the resistance heating method or the vacuum evaporation method such as the electron beam method, whereby the second electrode 6 is formed.

Figure 6A:
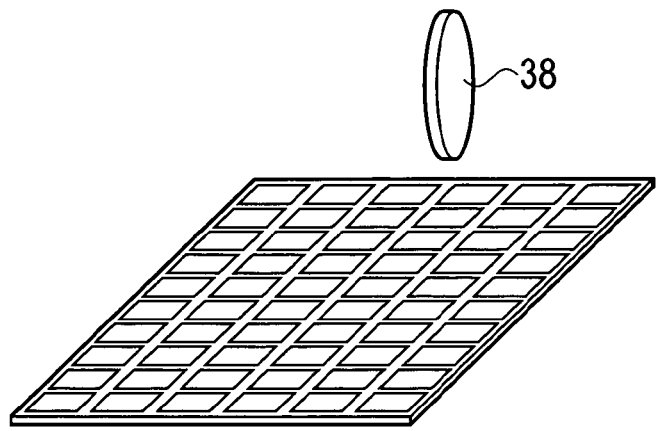
FIGS. 6a to 6C are process cross-sectional views for explaining a manufacturing method of a semiconductor light emitting device according to a second embodiment of the present invention.
Figure 6B:
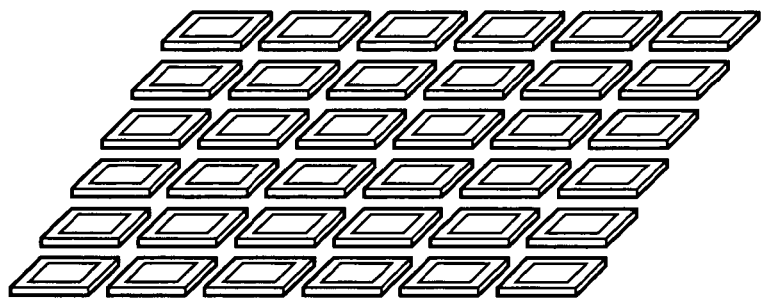

As shown in FIG. 6A, by using a wafer cutting instrument such as a dicing blade 38, the substrate 2 is diced per device unit. By such dicing, the substrate 2 is subjected to the chip division per device unit as shown in FIG. 6B.

Figure 6C:
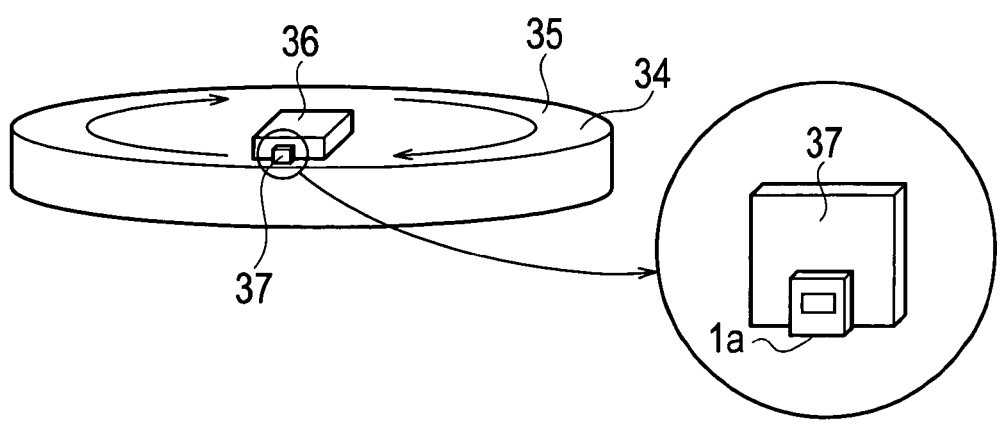

Each of the side end surfaces 1a of the devices subjected to the chip division is a rough surface since the side end surface 1a is cut out by the dicing. Accordingly, the entire side end surface 1a of the substrate 2 is polished and subjected to the mirror finish treatment. In the case where the thickness of the substrate 2 is as thin as, for example, approximately 100 µm, it is difficult to polish the side end surface 1a. In this case, for example as shown in FIG. 6C, the dummy substrate 37 onto which the device subjected to the chip division is pasted is attached onto the jig 36. Then, the jig 36 is placed on the polishing apparatus 35, the side end surface 1a of the substrate 2 is polished by the polishing sheet 34 of the polishing apparatus 35, whereby the side end surface 1a is subjected to the mirror finish treatment. By the above-described steps, the semiconductor light emitting device 1 in accordance with the manufacturing method according to the second embodiment is completed.

In the above-described step of polishing the side end surfaces 1a, the method using the polishing sheet 34 has been shown; however, the side end surfaces 1a may be polished by using the CMP method, or the polishing sheet 34 and the CMP method may be combined together.

In accordance with the manufacturing method of the semiconductor light emitting device 1 according to the second embodiment of the present invention, the chip division is performed per device unit by the dicing. Accordingly, even if the substrate 2 is thick, the chip division is possible. Therefore, the step of polishing the back surface 2b side of the substrate 2 by the mechanical polishing can be omitted.

Third Embodiment

A description will be made below of a manufacturing method of a semiconductor light emitting device 1 according to a third embodiment of the present invention. A configuration of the semiconductor light emitting device 1 manufactured by the manufacturing method according to the third embodiment is substantially similar to that of the semiconductor light emitting device 1 described in the first embodiment, and accordingly, a duplicate description will be omitted.

There is prepared such a substrate 2, which is formed of the single crystal of GaN, and in which the surface 2a is the m-plane, and the thickness is approximately 300 µm. The light emitting portion 3 is epitaxially grown on the surface 2a of the substrate 2 by the MOCVD method.

Next, by the sputtering method or the vacuum evaporation method, the first electrode portion 4 formed of ZnO is formed entirely on the light extraction surface 15a of the second semiconductor layer 15.

The first electrode portion 4 and the light emitting portion 3 are etched by using, as an etching mask, the resist formed into the desired pattern, whereby a partial region of the first semiconductor layer 11 is mesa-etched, and the electrode surface is exposed. Then, the Ti layer and the Al layer are sequentially stacked on the exposed electrode surface by the resistance heating method or the vacuum evaporation method such as the electron beam method, whereby the second electrode 6 is formed.

Figure 7A:
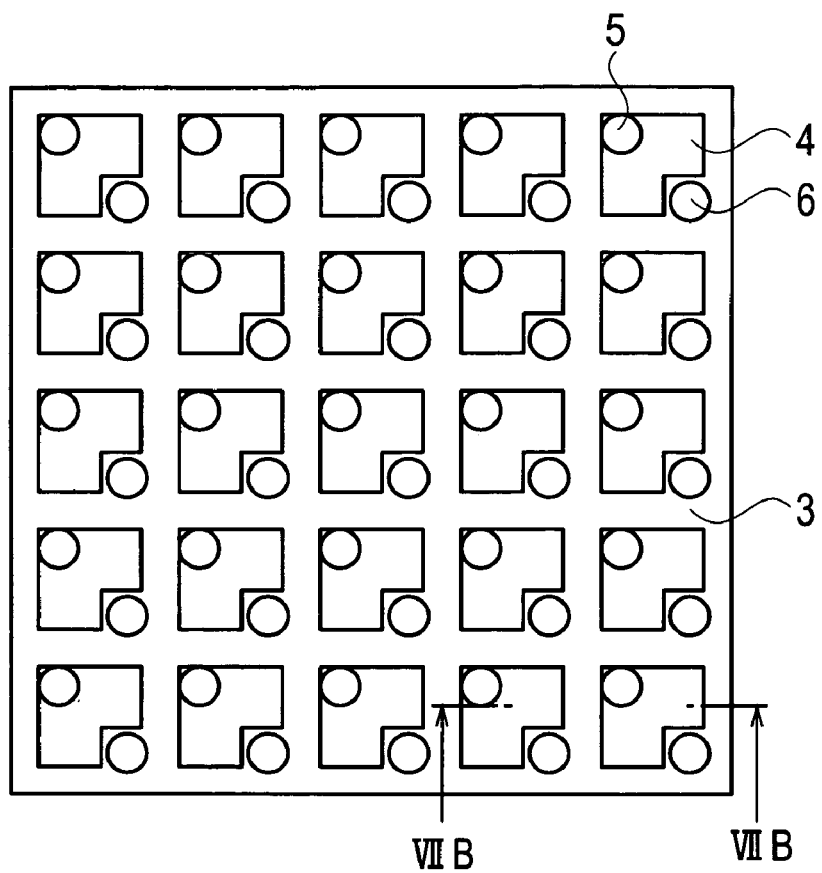
FIG. 7A is a plan view for explaining a manufacturing method of a semiconductor light emitting device according to a third embodiment of the present invention.
Figure 7B:
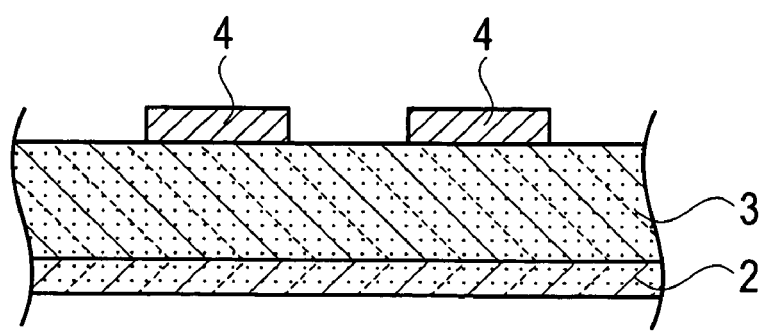
FIG. 7B is a cross-sectional view for explaining the manufacturing method of the semiconductor light emitting device according to the third embodiment of the present invention.

The back surface 2b side of the substrate 2 is polished by the mechanical polishing until the thickness of the substrate 2 becomes approximately 100 μm or less. A plan view of the devices, which are formed thus far, when viewed from the above is shown in FIG. 7A. A cross-sectional view of FIG. 7A when viewed from a direction VII B-VII B is shown in FIG. 7B.

Figure 8A:
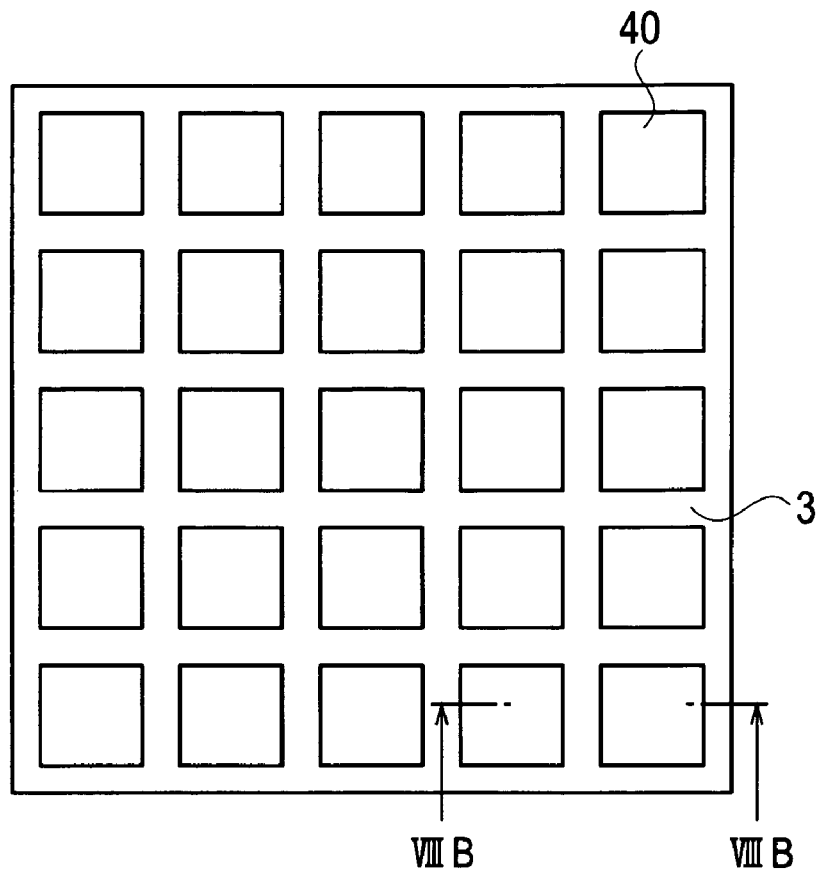
FIG. 8A is a plan view for explaining the manufacturing method of the semiconductor light emitting device according to the third embodiment of the present invention.
Figure 8B:
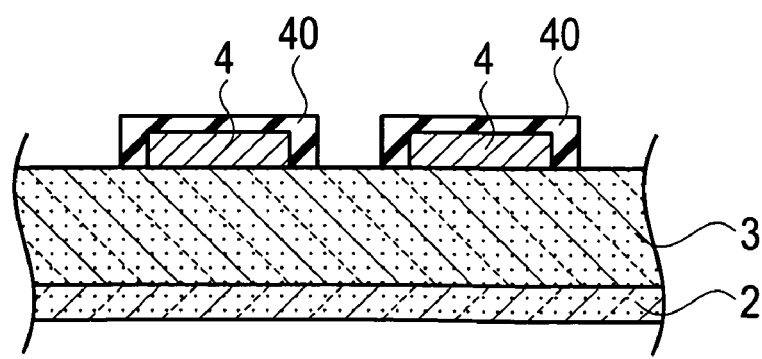
FIG. 8B is a cross-sectional view for explaining the manufacturing method of the semiconductor light emitting device according to the third embodiment of the present invention.
Figure 9:
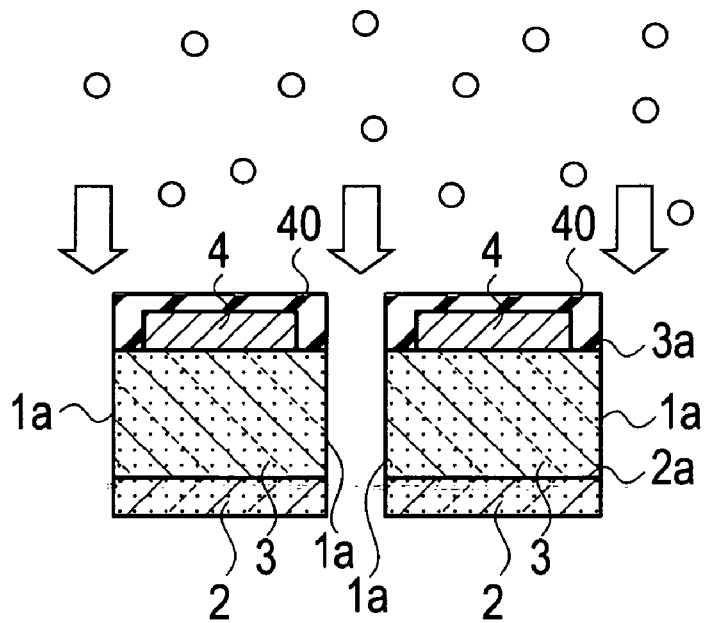
FIG. 9 is a cross-sectional view for explaining the manufacturing method of the semiconductor light emitting device according to the third embodiment of the present invention.
Figure 10:
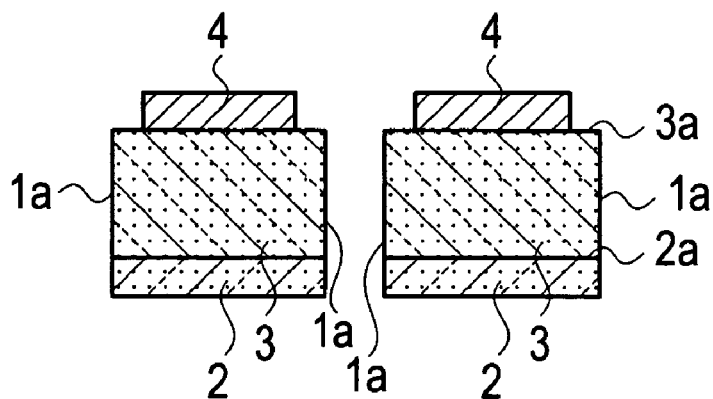
FIG. 10 is a cross-sectional view for explaining the manufacturing method of the semiconductor light emitting device according to the third embodiment of the present invention.

Subsequently, as shown in FIG. 8A and FIG. 8B, resist 40 is patterned on the devices in order to form grooves for performing the chip division for the substrate 2 per device unit. FIG. 8B is a cross-sectional view of FIG. 8A when viewed from a direction VIII B-VIII B. The devices on which the resist 40 is disposed are arranged in a vacuum chamber. After reaction gas such as silicon tetrachloride ($SiCl_4$) and chlorine ($Cl_2$) is introduced into the vacuum chamber, the reaction gas is excited by a high-frequency wave, a microwave and the like, whereby plasma is generated, and radicals, ions, electrons and the like are created in the vacuum chamber. As shown in FIG. 9, while using the resist 40 as masks, the light emitting portions 3 and the substrates 2, which are subjects to be etched, are made to react with the radicals, the ions, the electrons and the like in the vacuum chamber, and are thereby subjected to the chip division per device unit. At this time, the side end surfaces 1a formed by the chip division are subjected to the mirror finish treatment by dry etching. Thereafter, the resist 40 is removed as shown in FIG. 10, whereby the semiconductor light emitting device 1 in accordance with the manufacturing method according to the third embodiment is completed.

In accordance with the manufacturing method of the semiconductor light emitting device 1 according to the third embodiment of the present invention, the chip division per device unit and the mirror finish treatment for the side end surfaces 1a can be performed simultaneously. Moreover, the chip division is performed per device unit by the dry etching, and accordingly, the chip division can be performed in a collective manner.

Although such a chip division method by the dry etching has been illustrated in the above description, the semiconductor light emitting devices 1 may be formed by such chip division by wet etching.

Fourth Embodiment

For a backlight of a liquid crystal display onto which the polarization outputted from the semiconductor light emitting device 1 is made incident, and the like, an optical device (polarizer) that changes a propagation direction of the light incident thereonto from the semiconductor light emitting device 1 and outputs the incident light is used. If the semiconductor light emitting device 1 that outputs the polarization is used as such a liquid crystal backlight or a projector light source, then a light component attenuated in the polarizer is reduced, and the light emission efficiency is enhanced. The polarization outputted from the semiconductor light emitting device 1 is inputted to a liquid crystal panel through the polarizer, and an image is displayed on the liquid crystal display. The light made incident onto the polarizer (hereinafter, simply referred to as "incident light") is scattered in an inside of the polarizer, and is thereafter outputted uniformly from the entire light emitting surface that extracts the light to an outside of the polarizer. Specifically, a reflection pattern is formed on a reflecting surface that reflects the incident light in the inside of the polarizer, and the incident light is oriented by the reflection pattern, and propagates through the inside of the polarizer. The incident light that has propagated through the inside of the polarizer is outputted from the light emitting surface.

The semiconductor light emitting device 1 is mounted on a mounting base such as a base substrate and a package substrate by die bonding and the like, and the semiconductor light emitting device 1 thus mounted is molded by light transmissive resin such as silicon resin and epoxy resin. Specifically, a light emitting system in which the semiconductor light emitting device 1 is covered with the light transmissive resin is manufactured. For such molding of the light transmissive resin, an injection molding method and an extrusion molding method are adoptable.

However, in the light emitting system as described above, orientation occurs in resin molecules at the time when the light transmissive resin is subjected to thermal curing. Moreover, at such a thermal curing time, a residual stress occurs in an inside of the light transmissive resin. The occurrence of the orientation of the resin molecules and the occurrence of the residual stress allow appearance of birefringence in the inside of the light transmissive resin, and by the appearance of the birefringence, there is an apprehension that there may occur disturbance in the polarization emitted from the semiconductor light emitting device 1. A fourth embodiment of the present invention, which is shown in FIG. 11, relates to a light emitting system 100 capable of preventing the disturbance of the polarization outputted from the semiconductor light emitting device 1.

Figure 11:
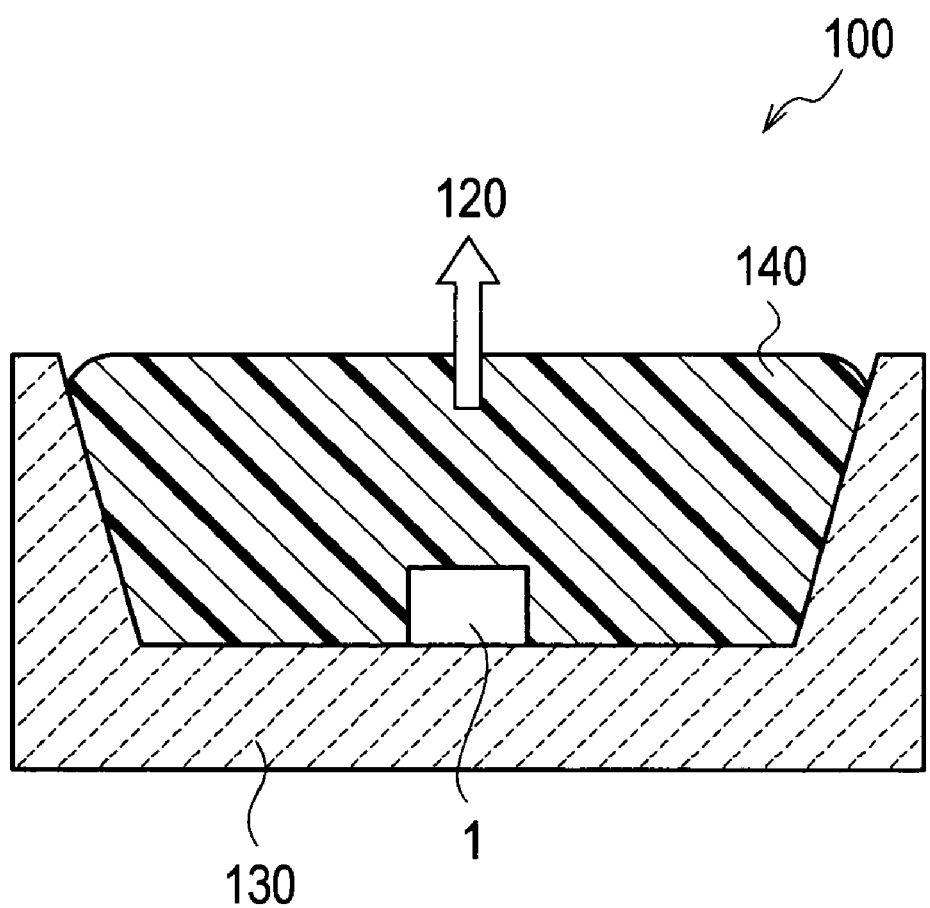
FIG. 11 is a configuration view of a light emitting system according to a fourth embodiment of the present invention.

As shown in FIG. 11, the light emitting system 100 includes: a mounting base 130; the semiconductor light emitting device 1 that is mounted on the mounting base 130, and outputs a polarization 120; and a light transmissive resin portion 140 that is disposed on the mounting base 130 so as to cover the semiconductor light emitting device 1, and transmits therethrough the polarization 120 outputted from the semiconductor light emitting device 1.

Figure 12:
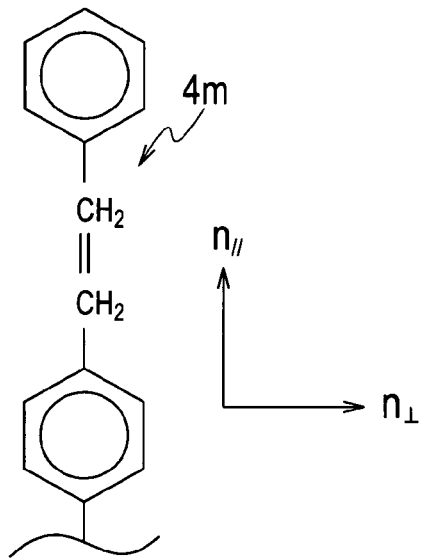
FIG. 12 is a resin molecule model view of a light transmissive resin portion of the light emitting system shown in FIG. 11.

The light transmissive resin portion 140 has a non-arrayed structure in resin molecules (4m), and does not exert the birefringence. Here, as represented in the following expression, a birefringence index Δn is defined by a difference between a refractive index n⊥ in a direction perpendicular to a molecular axis of the resin molecule 4m shown in FIG. 12 and a refractive index n// in a direction parallel to the molecular axis of the resin molecule 4m:

$$\Delta n = n\perp - n//$$

Figure 13:
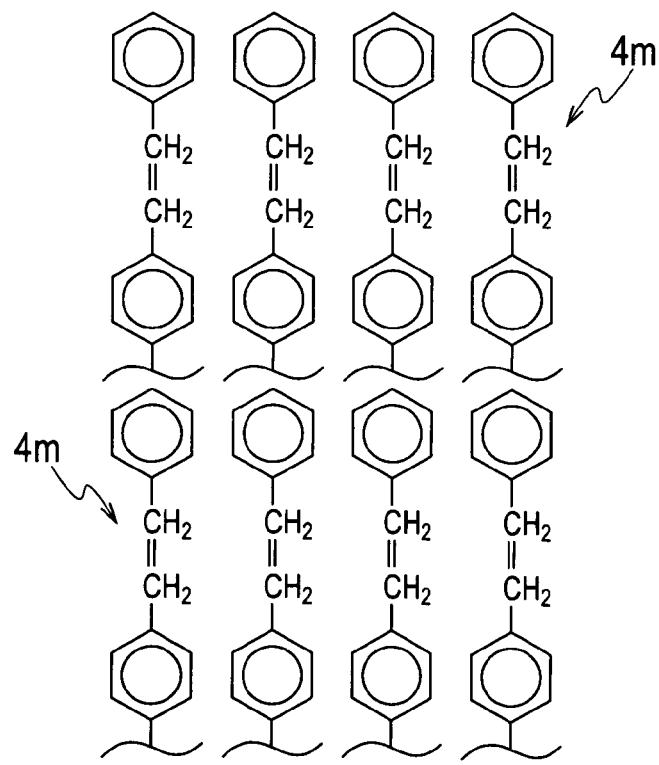
FIG. 13 is a view showing an orientation state of resin molecules of the light transmissive resin portion.

If the refractive index n⊥ and the refractive index n// are equal to each other, then the birefringence does not exist in the light transmissive resin portion 140. If a stress, heat and the like are suddenly applied to the light transmissive resin portion in a production process thereof, then the orientation occurs in the resin molecules 4m of the light transmissive resin portion as shown in FIG. 13. Specifically, the molecular axes of the resin molecules 4m are aligned regularly in one direction. In the light transmissive resin portion in which the resin molecules 4m as described above are oriented, macroscopic birefringence appears.

Figure 14:
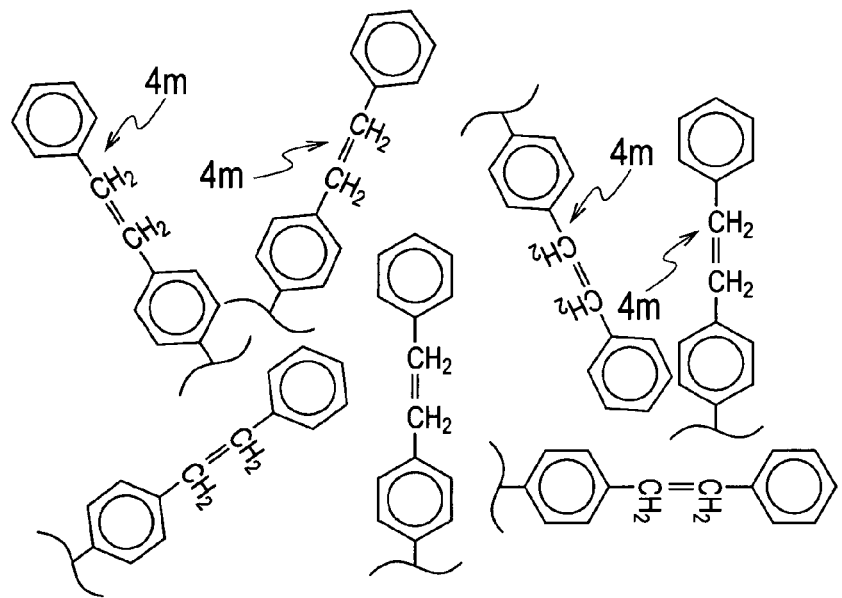
FIG. 14 is a model view showing a case where the resin molecules of the light transmissive resin portion of the light emitting system shown in FIG. 11 exist randomly.

As opposed to this, in the light emitting system 100, in the production process of the light transmissive resin portion 140, at least the occurrence of the stress is reduced, or at least such sudden heating is reduced. Accordingly, as shown in FIG. 14, arrays of the resin molecules 4m, that is, directions of the molecular axes of the resin molecules 4m are randomly controlled. Therefore, in the light transmissive resin portion 140 having the non-arrayed structure in the resin molecules 4m, the macroscopic birefringence does not appear. As a result, in the polarization outputted from the semiconductor light emitting device 1, the polarization state thereof is not disturbed in the case where the polarization transmits through the light transmissive resin portion 140.

As described above, in the fourth embodiment, the light transmissive resin portion 140 having the non-arrayed structure in the resin molecules 4m is provided, whereby the light emitting system 100 capable of preventing the disturbance of the polarization 120 outputted from the semiconductor light emitting device 1 can be realized.

Figure 15:
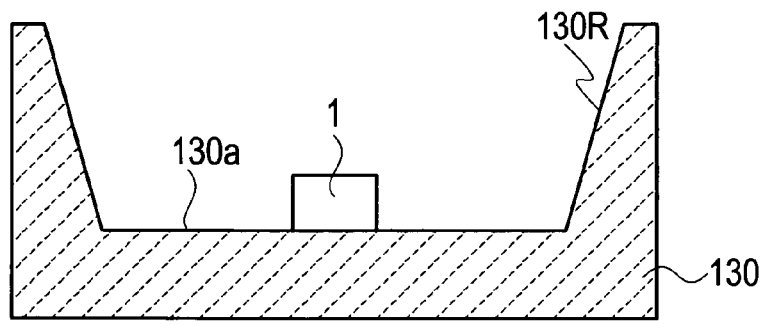
FIG. 15 is a process cross-sectional view for explaining a manufacturing method of the light emitting system according to the fourth embodiment of the present invention.

The mounting base 130 is a package substrate with a surface mount type structure, and as shown in FIG. 15, includes a reflector 130R and a mounting surface 130a, in which a cross-sectional shape perpendicular to the mounting surface 130a is a recessed shape. The semiconductor light emitting device 1 is mounted on the mounting surface 130a as a bottom surface of the mounting base 130, and the reflector 130R is composed so as to face to the side end surfaces 1a of the semiconductor light emitting device 1. The mounting surface 130a on which the semiconductor light emitting device 1 is mounted and the reflector 130R to which the side end surfaces 1a of the semiconductor light emitting device 1 face are connected to each other while making an angle larger than 90° therebetween. The mounting surface 130a and the reflector 130R are integrally composed.

Next, a description will be made of an example of a manufacturing method of the light emitting system 100 according to the fourth embodiment while referring to FIG. 15 to FIG. 18. First, as shown in FIG. 15, the semiconductor light emitting device 1 is mounted on the mounting surface 130a of the mounting base 130 by the die bonding method. Although not shown, at the stage where the semiconductor light emitting device 1 is mounted on the mounting base 130, or after this stage, the connection portion 5 and second electrode 6 of the semiconductor light emitting device 1 are electrically connected to electrodes arranged on the mounting surface 130a of the mounting base 130.

Figure 16:
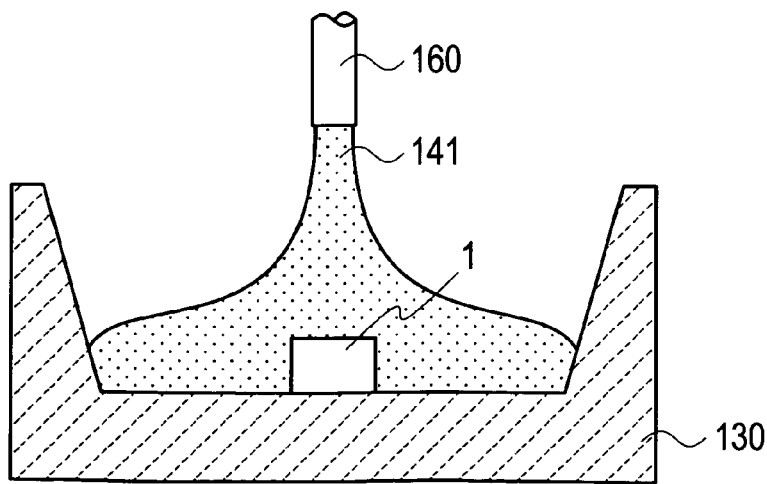
FIG. 16 is a process cross-sectional view for explaining the manufacturing method of the light emitting system according to the fourth embodiment of the present invention.
Figure 17:
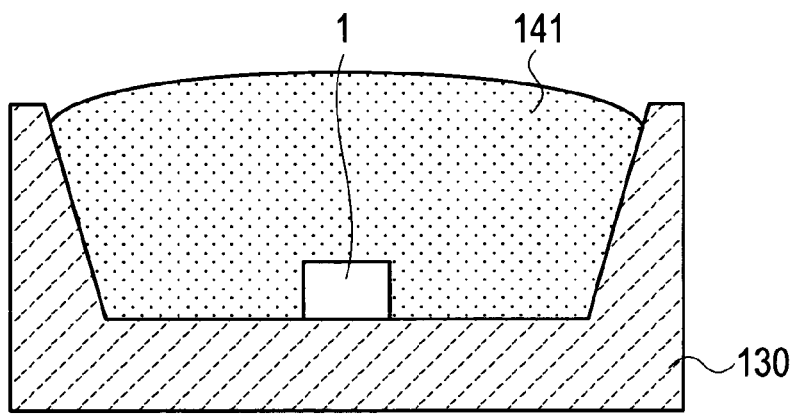
FIG. 17 is a process cross-sectional view for explaining the manufacturing method of the light emitting system according to the fourth embodiment of the present invention.

As shown in FIG. 16, by using a syringe drop-coating method, light transmissive resin 141 is drop-coated from a syringe 160 onto the semiconductor light emitting device 1 mounted on the mounting surface 130a of the mounting base 130. As shown in FIG. 17, the semiconductor light emitting device 1 is covered with the light transmissive resin 141, and the semiconductor light emitting device 1 is resin-sealed by the light transmissive resin 141. In the light transmissive resin 141 in which the syringe drop-coating method is used, the internal stress caused in the light transmissive resin 141 is reduced in comparison with a molding method of mold resin, such as the injection molding and the extrusion molding.

Figure 18:
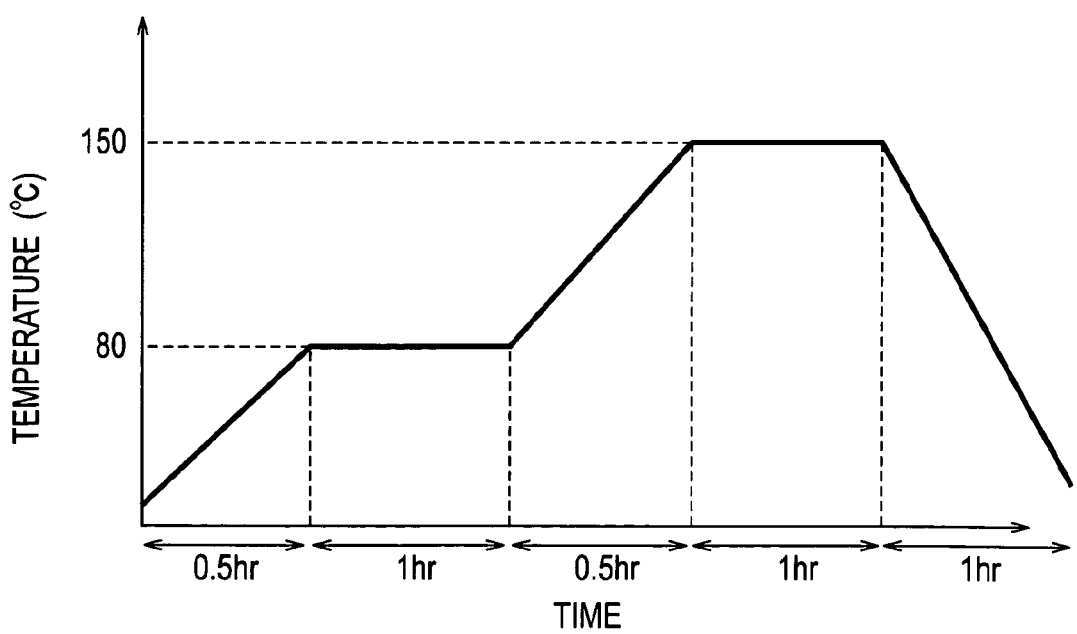
FIG. 18 is a chart for explaining a temperature raising method of the light transmissive resin portion of the light emitting system according to the fourth embodiment of the present invention.

Subsequently, as shown in FIG. 18, a temperature of the drop-coated light transmissive resin 141 is controlled step by step, and the light transmissive resin 141 is cured, whereby the light transmissive resin portion 140 is formed. Here, FIG. 18 shows condition data when the light transmissive resin portion is actually formed by using general sealing resin. An axis of abscissas represents a temperature rising time (hr), and axis of ordinates represents a heating temperature (° C.). In this step-by-step temperature raising method, first, heating for curing the light transmissive resin 141 is started, and for 0.5 hour, a heating temperature is linearly raised from room temperature to 80° C. Next, for 1.0 hour, the heating temperature is maintained constantly at 80° C. Subsequently, for 0.5 hour, the heating temperature is linearly raised from 80° C. to 150° C. as the maximum heating temperature. Subsequently, for 1.0 hour, the heating temperature is maintained constantly at 150° C. Thereafter, for 1.0 hour, the light transmissive resin portion 140 is cooled from 150° C. as the maximum heating temperature down to the room temperature. As a result of adopting such a step-by-step temperature controlling method as described above, the birefringence has not appeared in the light transmissive resin portion 140 after being cured.

The light transmissive resin portion 140 through which the polarization 120 transmits is formed, for example, to be transparent. However, it is not always necessary that the light transmissive resin portion 140 be transparent, and the light transmissive resin portion 140 may be formed by blending dye of any color of blue, green, red, orange and the like into the light transmissive resin.

In accordance with the above-described manufacturing method of the light emitting system according to the fourth embodiment, the light transmissive resin portion 140 that covers the semiconductor light emitting device 1 is formed by the drop-coating method, and the light transmissive resin portion 140 is cured by the step-by-step temperature control method. As a result, the disturbance of the polarization state of the polarization 120 outputted from the semiconductor light emitting device 1 can be prevented.

<Modification>

Figure 19:
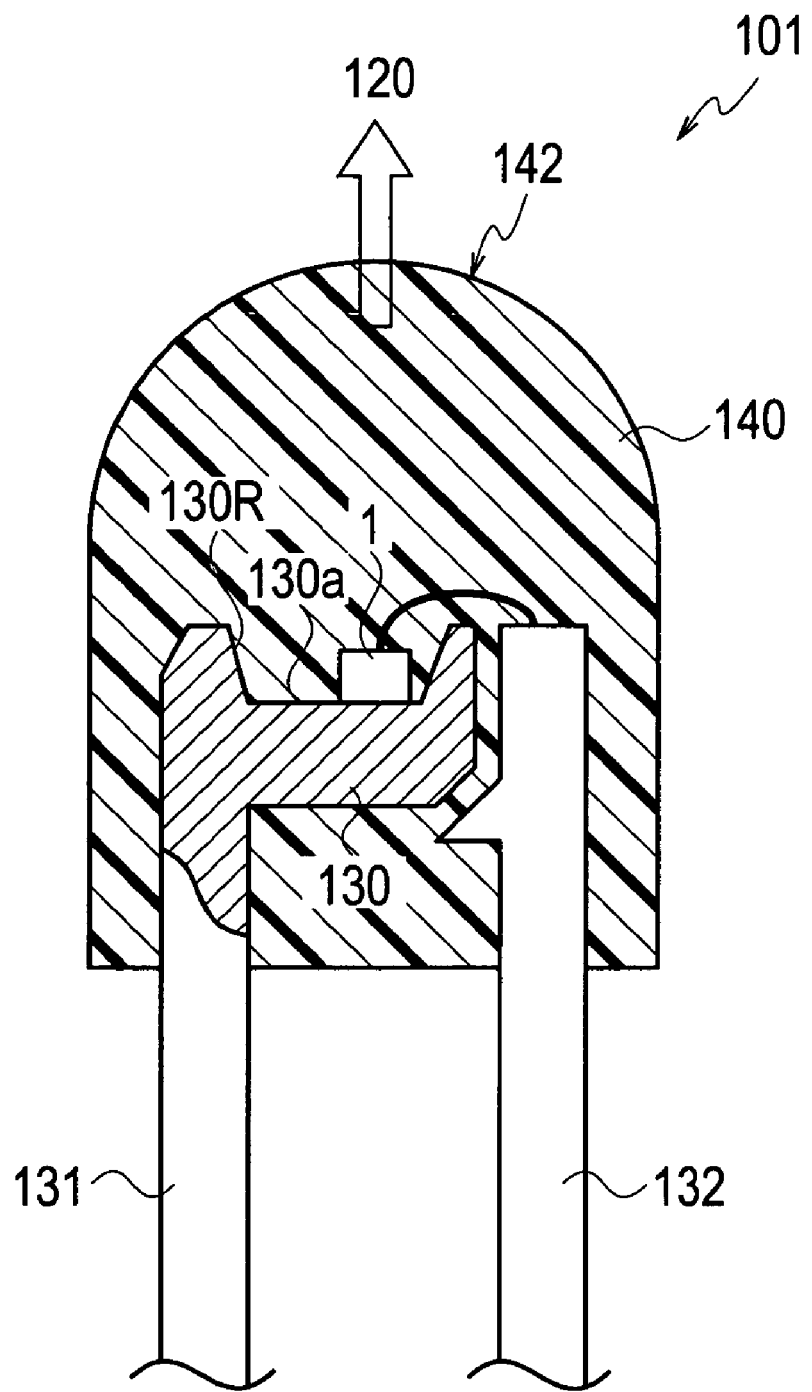
FIG. 19 is a configuration view showing a light emitting system according to a modification example of the fourth embodiment of the present invention.

FIG. 19 shows a light emitting system 101 according to a modification example of the fourth embodiment. As shown in FIG. 19, the light emitting system 101 is different from the light emitting system 100 having the surface mount structure shown in FIG. 11 in that a shell type package structure is provided. The light emitting system 101 includes: a mounting base 130; the semiconductor light emitting device 1 mounted on the mounting base 130; and a light transmissive resin portion 140 that covers the semiconductor light emitting device 1 and transmits therethrough the polarization 120 outputted by the semiconductor light emitting device 1.

The mounting base 130 shown in FIG. 19 is disposed on one end of a lead 131, and the mounting base 130 and the lead 131 are integrally composed. The lead 131 is used as a cathode electrode. A basic configuration of the mounting base 130 is similar to that of the mounting base 130 of the light emitting system 100 shown in FIG. 11, and the mounting base 130 has a recessed shape in cross section, in which a mounting surface 130a and a reflector 130R are integrated together. The semiconductor light emitting device 1 is mounted on the mounting surface 130a as a bottom surface of the mounting base 130, and the reflector 130R is composed to face to the side end surfaces 1a of the semiconductor light emitting device 1. A lead 132 is disposed in a region close to the lead 131. The lead 132 is used as an anode electrode, and one end of the lead 132 is electrically connected to the semiconductor light emitting device 1 through a wire.

The light transmissive resin portion 140 covers the mounting base 130 located on the one end of the lead 131, and covers the one end of the lead 132, and a portion thereof above the semiconductor light emitting device 1, that is, a portion thereof through which the polarization 120 outputted by the semiconductor light emitting device 1 transmits has a semispherical lens portion 142. In a similar way to the light transmissive resin portion 140 of the light emitting system 100 shown in FIG. 11, this light transmissive resin portion 140 in the modification example has the non-arrayed structure in the resin molecules 4m, and is thereby composed so as to suppress the appearance of the birefringence.

Fifth Embodiment

Figure 20:
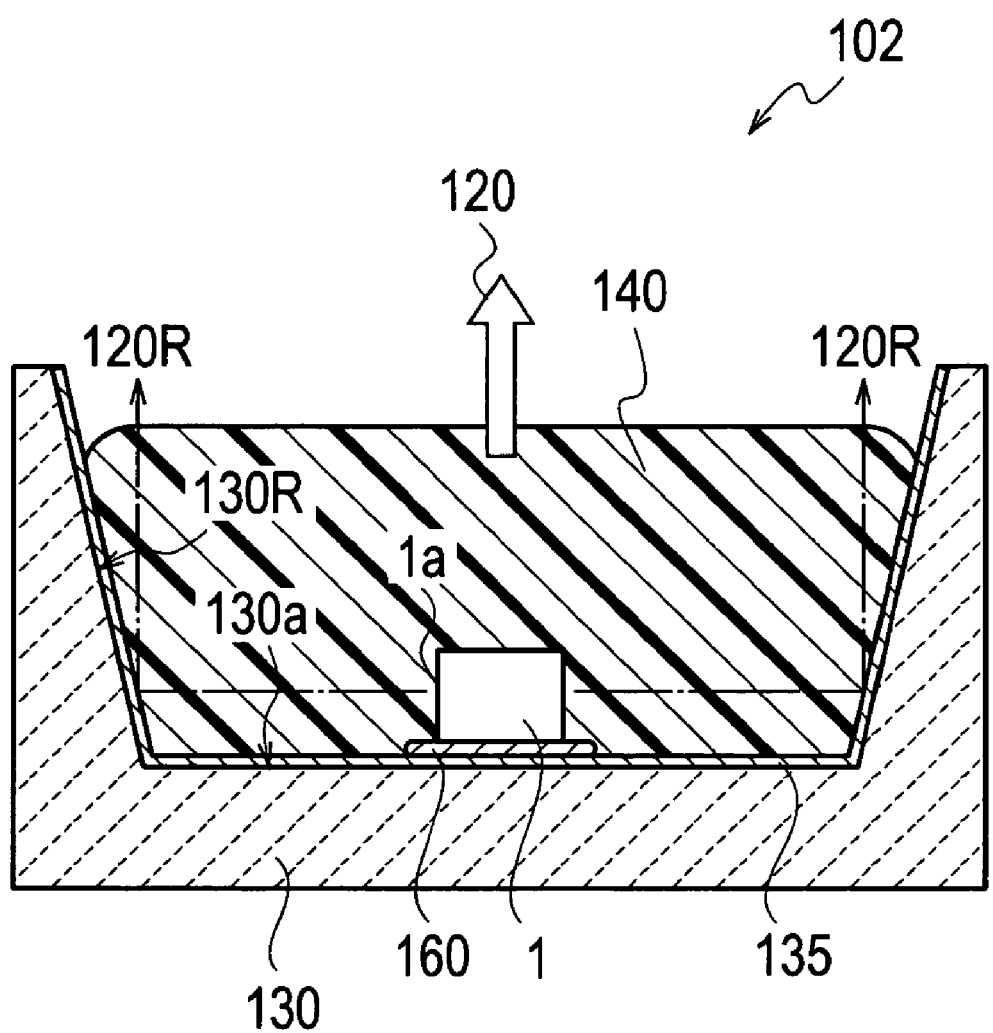
FIG. 20 is a configuration view showing a light emitting system according to a fifth embodiment of the present invention.

A light emitting system 102 according to a fifth embodiment of the present invention is shown in FIG. 20. The light emitting system 102 includes: the semiconductor light emitting device 1; and a mounting base 130 on which the semiconductor light emitting device 1 is mounted. At least a part of an inner surface of the mounting base 130 on which the semiconductor light emitting device 1 is mounted is a specular surface. Moreover, the light emitting system 102 includes the light transmissive resin portion 140 that covers the semiconductor light emitting device 1 and transmits therethrough the polarization 120 outputted from the semiconductor light emitting device 1.

The mounting base 130 is a package substrate with a surface mount type structure, and includes a reflector 130R and a mounting surface 130a, in which a cross-sectional shape perpendicular to the mounting surface 130a is a recessed shape. The semiconductor light emitting device 1 is mounted on the mounting surface 130a of the mounting base 130, and the reflector 130R is composed to face to the side end surfaces 1a of the semiconductor light emitting device 1. The mounting surface 130a and the reflector 130R are connected to each other while making an angle larger than 90° therebetween. The mounting surface 130a and the reflector 130R are integrally composed. For the mounting base 130, ceramics such as aluminum nitride (AlN) and alumina ($Al_2O_3$) can be adopted. The ceramics are fabricated by a firing method.

On an inner surface of the mounting base 130, which faces to the semiconductor light emitting device 1, that is, on the mounting surface 130a and the reflector 130R, a metal coating surface 135 is disposed, and this metal coating surface 135 is a specular surface. The semiconductor light emitting device 1 is electrically and mechanically connected onto the mounting surface 130a while interposing an adhesive 160 having conductivity therebetween. For the adhesive 160, for example, silver (Ag) paste is adoptable.

As shown in FIG. 20, besides the polarization 120 outputted from a light extraction surface 4a of the semiconductor light emitting device 1, polarizations 120R are outputted from the side end surfaces 1a and back surface 2b of the semiconductor light emitting device 1. "The metal coating surface 135 is the specular surface" is used in the meaning that the metal coating surface 135 is a reflecting surface that reduces diffused reflection of the polarizations 120R and does not disturb polarization characteristics of the polarization 120. Specifically, if the reflecting surface has surface roughness of one-fourth or less of a wavelength of the polarizations 120R outputted from the semiconductor light emitting device 1, then the diffused reflection does not occur in the polarizations 120R which reflect on the reflecting surfaces. For example, in the case where the wavelength of the polarizations 120R emitted from the semiconductor light emitting device 1 is 400 nm, the surface roughness of the metal coating surface 135 is set at 100 nm or less. Here, "the surface roughness" is, for example, the difference in irregularities of the surface.

For the metal coating surface 135, a metal thin film having high reflectance, which is made of either aluminum (Al) and Ag and deposited by an electrolytic plating method, and the like are adoptable. These metal thin films are deposited, for example, at a film thickness of several hundred nanometers to several micrometers. Note that, as such a deposition method of the metal thin film, other deposition methods such as a sputtering method may be used.

The light transmissive resin portion 140 shown in FIG. 20 is filled into a recessed portion composed of the mounting surface 130a and the reflector 130R, and covers a surface of the semiconductor light emitting device 1. The polarization 120 that is outputted after transmitting through a first electrode portion 4 of the semiconductor light emitting device 1 and the polarizations 120R which are outputted from the side end surfaces 1a and the back surface 2b and are reflected by the reflector 130R transmit through the light transmissive resin portion 140. For the light transmissive resin portion 140, for example, silicon resin, epoxy resin and the like are adoptable; however, a material of the light transmissive resin portion 140 is not limited to these resin materials. Moreover, the light transmissive resin portion 140 may be the light transmissive resin having the non-arrayed structure in the resin molecules 4m, which is described in the fourth embodiment.

In the light emitting system 102 according to the fifth embodiment, which is composed as described above, the inner surface of the mounting base 130 on which the semiconductor light emitting device 1 is mounted is the specular surface. Therefore, the diffused reflection of the polarizations 120R outputted from the side end surfaces 1a and back surface 2b of the semiconductor light emitting device 1 can be reduced, and the disturbance of the polarization state of the polarization 120 can be suppressed.

<Modification>

Figure 21:
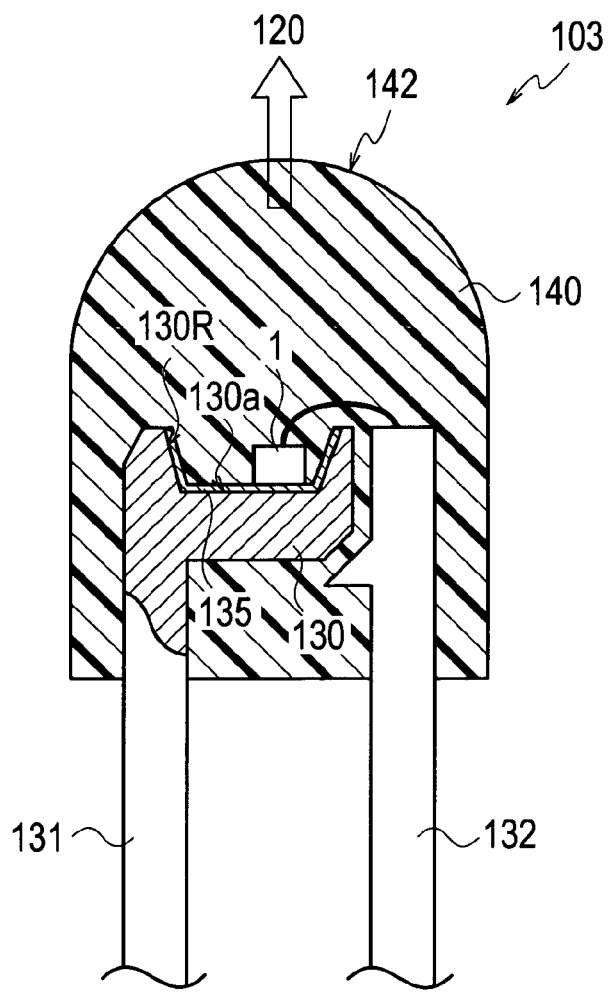
FIG. 21 is a configuration view showing a light emitting system according to a modification example of the fifth embodiment of the present invention.

A light emitting system 103 according to a modification example of the fifth embodiment is shown in FIG. 21. The light emitting system 103 is different from the light emitting system 102 having the surface mount type structure shown in FIG. 20 in that a shell type package structure is provided.

A mounting base 130 shown in FIG. 21 is disposed on one end of a lead 131, and the mounting base 130 and the lead 131 are integrally composed. The lead 131 is used as a cathode electrode. A basic configuration of the mounting base 130 is similar to that of the mounting base 130 of the light emitting system 102 shown in FIG. 20, and the mounting base 130 has a recessed shape in cross section, in which a mounting surface 130a and a reflector 130R are combined. The semiconductor light emitting device 1 is mounted on the mounting surface 130a as a bottom surface of the mounting base 130, and the reflector 130R is composed to face to the side end surfaces 1a of the semiconductor light emitting device 1. In a similar way to the mounting base 130 shown in FIG. 20, on an inner surface of the mounting base 130, which faces to the semiconductor light emitting device 1, that is, on the mounting surface 130a and on the reflector 130R, a metal coating surface 135 is disposed.

A lead 132 is disposed in a region close to the lead 131. The lead 132 is used as an anode electrode, and one end of the lead 132 is electrically connected to the semiconductor light emitting device 1 through a wire.

The light transmissive resin portion 140 shown in FIG. 21 covers the mounting base 130 located on the one end of the lead 131, and covers the one end of the lead 132, and a portion thereof above the semiconductor light emitting device 1, that is, a portion thereof through which the polarization 120 outputted after transmitting through the first electrode portion 4 of the semiconductor light emitting device 1 transmits has a semispherical lens portion 142. In a similar way to the light emitting system 102 shown in FIG. 20, the silicon resin, the epoxy resin and the like are adoptable for the light transmissive resin portion 140.

Other Embodiment

Figure 22:
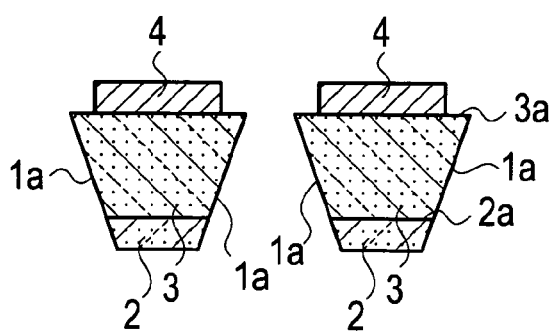
FIG. 22 is a cross-sectional view showing a configuration example of a semiconductor light emitting device according to another embodiment of the present invention.

In the first to fifth embodiments, examples have been described, where angles made by the side end surfaces 1a of the semiconductor light emitting device 1 with respect to the surface 2a of the substrate 2 and the surface 3a of the light emitting portion 3 are right angles. However, as shown in FIG. 22, the angles made by the side end surfaces 1a with respect to the surface 2a of the substrate 2 and the surface 3a of the light emitting portion 3 may be larger than 90°. Specifically, cut surfaces of the semiconductor light emitting device 1 in the direction perpendicular to the growth principal surface of the semiconductor light emitting device 1 may have a tapered shape.

By the fact that the angles made by the side end surfaces 1a with respect to the surface 2a of the substrate 2 and the surface 3a of the light emitting portion 3 are larger than 90°, a part of the light made incident onto each of the side end surfaces 1a is reflected by the side end surface 1a, and travels toward the direction of the first electrode portion 4. Therefore, light gathering efficiency to the direction of the first electrode portion 4 can be enhanced. As a method for forming the side end surfaces 1a, in which the angles made with respect to the surface 2a of the substrate 2 and the surface 3a of the light emitting portion 3 are not the right angles, and which are the specular surfaces, there are adoptable: a polishing method in which the jig 36 is placed on the polishing apparatus 35 shown in FIG. 3D and FIG. 6C so as to have a desired angle; a method utilizing isotropy of the wet etching; and the like.

Various modifications will become possible for those skilled in the art after receiving the teachings of the present disclosure without departing from the scope thereof.

The first to fifth embodiments may be combined together, and a configuration obtained by such combination is also incorporated in the embodiments of the present invention.

What is claimed is:

1. A semiconductor light emitting device comprising:
  a substrate; and
  a light emitting portion that is disposed on the substrate, and includes an active layer formed of a group III nitride semiconductor using a nonpolar plane or a semipolar plane as a growth principal surface, in which side end surfaces of the active layer are specular surfaces.

2. The semiconductor light emitting device of claim 1, wherein a difference in irregularities of the side end surfaces is equal to or less than a wavelength of a polarization outputted by the active layer.

3. The semiconductor light emitting device of claim 1, wherein the substrate is GaN.

4. The semiconductor light emitting device of claim 1, wherein the growth principal surface is an m-plane.

5. The semiconductor light emitting device of claim 1, wherein a thickness of the substrate is equal to or less than 100 µm.

6. The semiconductor light emitting device of claim 1, wherein cut surfaces of the semiconductor light emitting device in a direction perpendicular to the growth principal surface have a tapered shape.

7. The semiconductor light emitting device of claim 1, wherein the light emitting portion is formed of the group III nitride semiconductor using the nonpolar plane or the semipolar plane as a principal surface, and has a structure in which a first semiconductor layer of a first conduction type, the active layer and a second semiconductor layer of a second conduction type are stacked in this order.

8. A light emitting system comprising:
  a mounting base;
  a semiconductor light emitting device that is disposed on the mounting base, and includes a light emitting portion having an active layer formed of a group III nitride semiconductor using a nonpolar plane or a semipolar plane as a growth principal surface, in which side end surfaces of the active layer are specular surfaces; and
  a light transmissive resin portion that is disposed on the mounting base so as to cover the semiconductor light emitting device, and has a non-arrayed structure in resin molecules.

9. The light emitting system of claim 8, wherein array of the resin molecules is random in the light transmissive resin portion.

10. The light emitting system of claim 8, wherein a refractive index of the light transmissive resin portion in a direction perpendicular to molecular axes of the resin molecules and a refractive index of the light transmissive resin portion in a direction parallel to the molecular axes are equal to each other.

11. The light emitting system of claim 8, wherein the mounting base comprises:
  a mounting surface on which the semiconductor light emitting device is mounted; and
  a reflector to which the side end surfaces of the active layer face,
  wherein the mounting surface and the reflector are connected to each other while making an angle larger than 90° therebetween.

12. The light emitting system of claim 8, wherein the growth principal surface is an m-plane.

13. The light emitting system of claim 8, wherein cut surfaces of the semiconductor light emitting device in a direction perpendicular to the growth principal surface have a tapered shape.

14. The light emitting system of claim 8, wherein the light emitting portion is formed of the group III nitride semiconductor using the nonpolar plane or the semipolar plane as a principal surface, and has a structure in which a first semiconductor layer of a first conduction type, the active layer and a second semiconductor layer of a second conduction type are stacked in this order.

15. A light emitting system comprising:
  a mounting base; and
  a semiconductor light emitting device that is disposed on the mounting base, and includes a light emitting portion having an active layer formed of a group III nitride semiconductor using a nonpolar plane or a semipolar plane as a growth principal surface, in which side end surfaces of the active layer are specular surfaces,
  wherein at least a part of an inner surface of the mounting base, the inner surface facing to the semiconductor light emitting device, is a specular surface.

16. The light emitting system of claim 15, wherein the inner surface of the mounting base comprises:
  a mounting surface on which the semiconductor light emitting device is mounted; and
  a reflector to which the side end surfaces of the active layer face,
  wherein the mounting surface and the reflector are specular surfaces.

17. The light emitting system of claim 15, wherein a difference in irregularities of the inner surface of the mounting base is equal to or less than one-fourth of a wavelength of a polarization outputted from the semiconductor light emitting device.

18. The light emitting system of claim 15, wherein a difference in irregularities of the inner surface of the mounting base is equal to or less than 100 nm.

19. The light emitting system of claim 15, wherein the growth principal surface is an m-plane.

20. The light emitting system of claim 15, wherein cut surfaces of the semiconductor light emitting device in a direction perpendicular to the growth principal surface have a tapered shape.

* * * * *